(12) United States Patent
Watanabe et al.

(10) Patent No.: US 10,153,241 B2
(45) Date of Patent: Dec. 11, 2018

(54) SEMICONDUCTOR DEVICE AND METHOD OF MANUFACTURING THE SAME

(71) Applicant: TOYOTA JIDOSHA KABUSHIKI KAISHA, Toyota-shi, Aichi (JP)

(72) Inventors: Takemasa Watanabe, Toyota (JP); Naoya Take, Toyota (JP); Sachio Kodama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/854,924

(22) Filed: Dec. 27, 2017

(65) Prior Publication Data

US 2018/0218987 A1    Aug. 2, 2018

(30) Foreign Application Priority Data

Jan. 30, 2017   (JP) .................. 2017-014502

(51) Int. Cl.
 *H01L 29/40*  (2006.01)
 *H01L 23/00*  (2006.01)

(52) U.S. Cl.
 CPC ............. *H01L 24/05* (2013.01); *H01L 24/85* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/04026* (2013.01); *H01L 2224/04042* (2013.01); *H01L 2224/05015* (2013.01); *H01L 2224/05076* (2013.01); *H01L 2224/05124* (2013.01); *H01L 2224/05184* (2013.01); *H01L 2224/05188* (2013.01); *H01L 2224/05624* (2013.01); *H01L 2224/05684* (2013.01); *H01L 2224/05686* (2013.01); *H01L 2224/0603* (2013.01); *H01L 2224/06051* (2013.01); *H01L 2224/06181* (2013.01); *H01L 2224/291* (2013.01); *H01L 2224/32225* (2013.01); *H01L 2224/4502* (2013.01); *H01L 2224/45147* (2013.01); *H01L 2224/48453* (2013.01); *H01L 2224/48463* (2013.01); *H01L 2224/49175* (2013.01); *H01L 2224/73265* (2013.01); *H01L 2224/85205* (2013.01); *H01L 2924/05442* (2013.01); *H01L 2924/1033* (2013.01);

(Continued)

(58) Field of Classification Search
 CPC ........... H01L 24/05; H01L 2224/05188; H01L 24/45; H01L 24/85; H01L 2224/04042; H01L 2224/05076; H01L 2224/05124; H01L 2224/05184; H01L 2224/4502; H01L 2224/45147
 See application file for complete search history.

(56) References Cited

U.S. PATENT DOCUMENTS

| | | | |
|---|---|---|---|
| 2013/0008625 A1* | 1/2013 | Yoshida | ................ B22C 1/185 164/527 |
| 2014/0225139 A1* | 8/2014 | Park | ........................ H01L 33/62 257/98 |
| 2017/0062313 A1* | 3/2017 | Miwatashi | .............. H01L 24/05 |

FOREIGN PATENT DOCUMENTS

JP         2012-109419 A       6/2012

* cited by examiner

*Primary Examiner* — Elias M Ullah
(74) *Attorney, Agent, or Firm* — Oliff PLC (57) ABSTRACT

A semiconductor device is provided. The semiconductor device includes an electrode pad provided above a semiconductor substrate; and a wire bonded on the electrode pad and including copper. The electrode pad includes an electrode layer including aluminum and a support layer harder than the wire and the electrode layer. The wire is in contact with the electrode layer and the support layer.

10 Claims, 8 Drawing Sheets

(52) U.S. Cl.
CPC ............... *H01L 2924/10253* (2013.01); *H01L 2924/10272* (2013.01); *H01L 2924/35121* (2013.01)

SEMICONDUCTOR DEVICE AND METHOD OF MANUFACTURING THE SAME

TECHNICAL FIELD

A technique disclosed herein relates to a semiconductor device and a method of manufacturing the same.

BACKGROUND

Japanese Patent Application Publication. No. 2012-409419 discloses a technique of bonding a wire made of copper on an electrode pad made of aluminum. The wire is harder than the electrode pad, and hence at bonding, the electrode pad is crushed by the wire, and a material that constitutes the electrode pad is pushed out from below the wire to a periphery of the electrode pad. Consequently, the electrode pad projects around a bonded portion. This phenomenon is generally called aluminum splash. When aluminum splash occurs, downsizing of an electrode pad becomes difficult. The technique in Japanese Patent Application Publication No. 2012-409419 suppresses aluminum splash by providing an interlayer film partially below the electrode pad.

SUMMARY

The technique in Japanese Patent Application Publication No. 2012-409419 cannot sufficiently suppress aluminum splash. The disclosure herein provides a technique of suppressing aluminum splash more suitably.

A semiconductor device disclosed herein may comprise: an electrode pad provided above a semiconductor substrate; and a wire bonded on the electrode pad and including copper. The electrode pad comprises an electrode layer including aluminum and a support layer harder than the wire and the electrode layer. The wire is in contact with the electrode layer and the support layer.

It should be noted, in the disclosure herein, hardness means Vickers hardness.

The electrode pad in this semiconductor device comprises the electrode layer and the support layer. The electrode layer that includes aluminum is softer than the wire that includes copper. The support layer is harder than the wire and the electrode layer. The wire is in contact with the electrode layer and the support layer. In other words, the wire is bonded to make contact with the electrode layer and the support layer. At bonding, a load is imposed to the electrode layer and the support layer from the wire. At this time, the hard support layer does not deform much, and consequently, deformation of the electrode layer is also suppressed. Accordingly, aluminum splash is suppressed from occurring at the electrode layer. Moreover, the wire that includes copper and the electrode layer that includes aluminum are suitably connected. Therefore, according to the semiconductor device with this structure, it is possible to suitably connect the wire to the electrode pad, while suppressing aluminum splash.

Further, a method of manufacturing a semiconductor device is provided herein. The method may comprise bonding a wire including copper on an electrode pad provided above a semiconductor substrate. The electrode pad comprises an electrode layer including aluminum and a support layer harder than the wire and the electrode layer. The wire is bonded on the electrode pad so that the wire makes contact with the electrode layer and the support layer in the bonding.

According to this configuration, in the bonding, the hard support layer does not deform much, and consequently, deformation of the electrode layer is also suppressed. Accordingly, aluminum splash can be suppressed.

DETAILED DESCRIPTION

Figure 1:
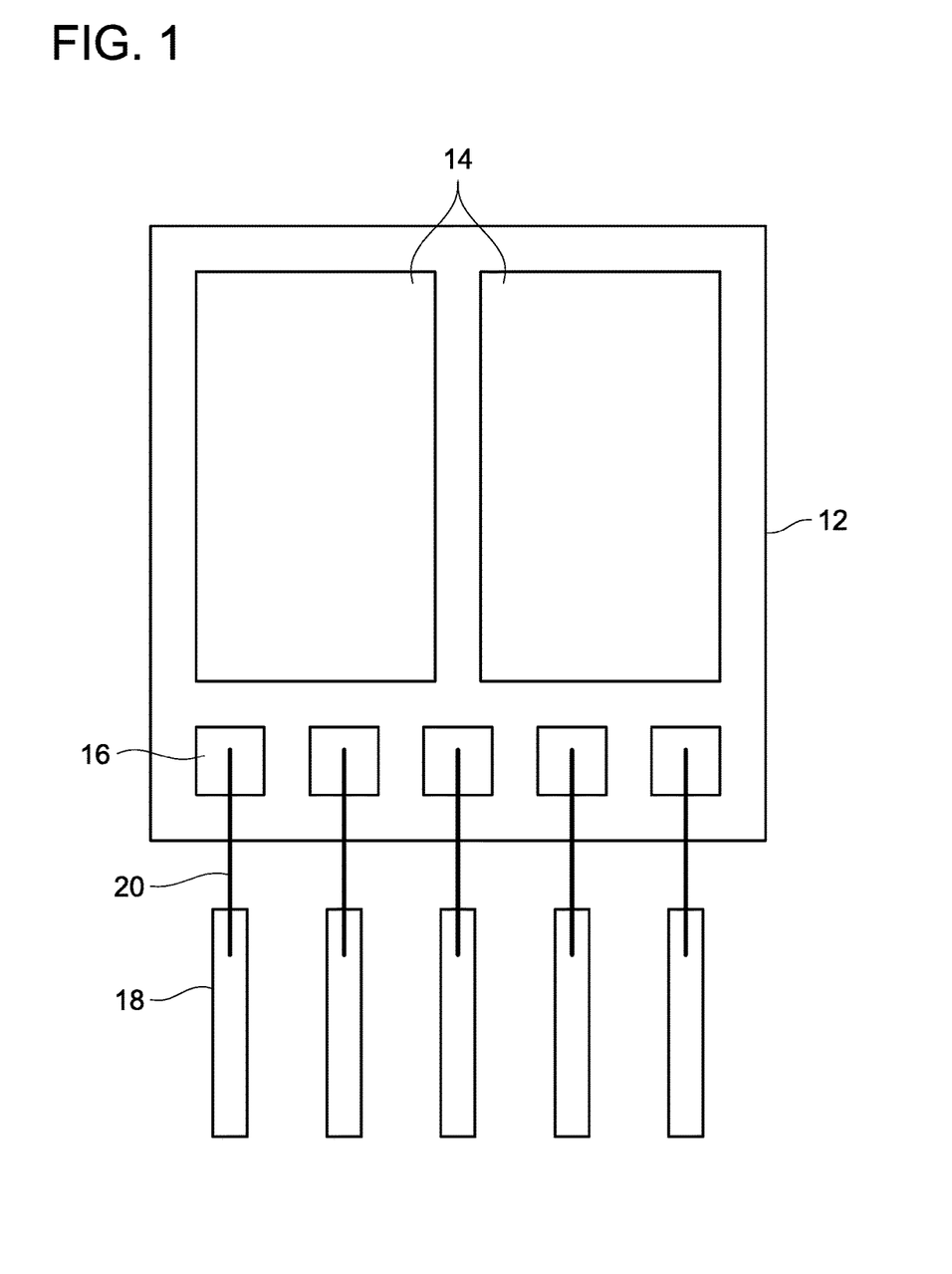
FIG. 1 is a top view of a semiconductor device.

FIG. 1 illustrates an upper surface of a semiconductor device. The semiconductor device comprises a semiconductor substrate 12. The semiconductor substrate 12 is constituted of a semiconductor that mainly contains Si (silicon). It should be noted that the semiconductor substrate 12 may be constituted of a wide band gap semiconductor that mainly contains SiC (silicon carbide), GaN (gallium nitride), or the like. On an upper surface of the semiconductor substrate 12, main electrodes 14 and signal electrode pads 16 are provided. A size of each signal electrode pad 16 is smaller than a size of each main electrode 14. The main electrodes 14 are connected to a wiring member, which is not shown, by solder. Adjacent to one side of the semiconductor substrate 12, a plurality of lead wires 18 are provided. Each signal electrode pad 16 is connected to corresponding one of the lead wires 18 by a wire 20. Moreover, although not shown, a lower electrode is provided on a lower surface of the semiconductor substrate 12. The lower electrode is connected to a wiring member, which is not shown, by soldering.

Figure 2:
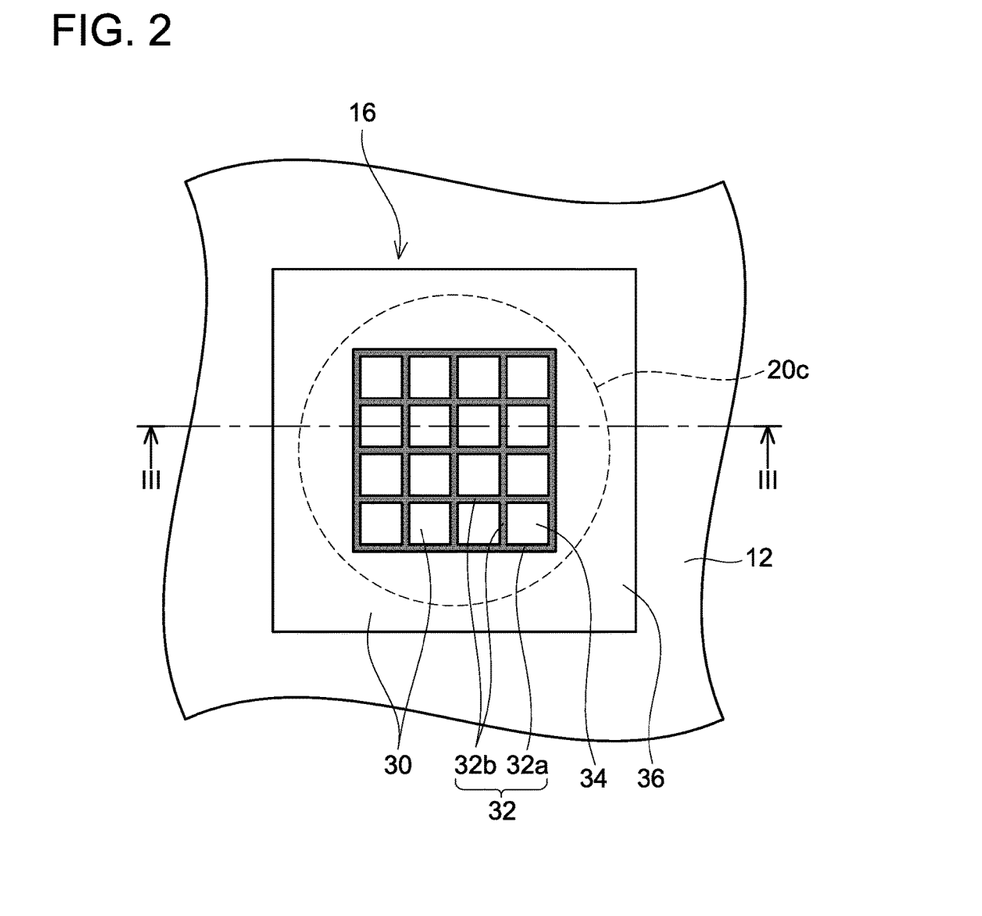
FIG. 2 is an enlarged top view of a signal electrode pad 16.
Figure 3:
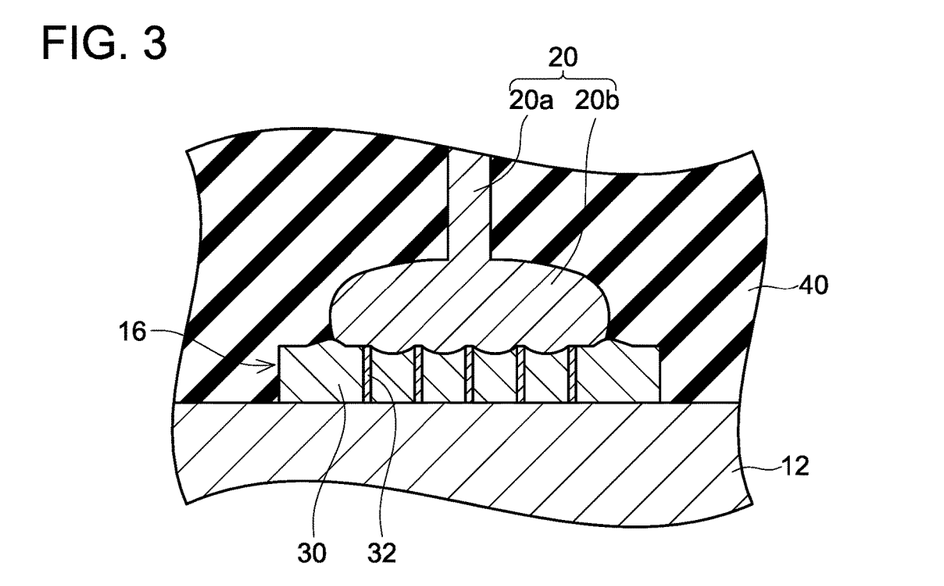
FIG. 3 is an enlarged cross-sectional view of the signal electrode pad 16 and a wire 20.

FIG. 2 is an enlarged view of one of the signal electrode pads 16. Moreover, FIG. 3 is a cross-sectional view taken along a line III-III in FIG. 2. As shown in FIGS. 2 and 3, the signal electrode pad 16 is provided on the upper surface of the semiconductor substrate 12. It should be noted, in FIGS. 2 and 3, although the signal electrode pad 16 is in direct contact with the upper surface of the semiconductor substrate 12, another layer (e.g., an interlayer insulating film) may be provided between the signal electrode pad 16 and the semiconductor substrate 12. The signal electrode pad 16 comprises an electrode layer 30 and a support layer 32.

The electrode layer 30 is a metal layer that mainly contains alumni or AlSi (an alloy of aluminum and silicon). For example, the electrode layer 30 may be constituted of a simple substance of aluminum, or may be constituted of AlSi. The electrode layer 30 constitutes a most part of the signal electrode pad 16.

The support layer 32 is a metal layer that mainly contains tungsten. For example, the support layer 32 may be constituted of a simple substance of tungsten. The support layer 32 is harder than the electrode layer 30. The support layer 32 is embedded in the electrode layer 30. As shown in FIG. 2, the support layer 32 is exposed at an upper surface of the signal electrode pad 16. In a range where no support layer 32 exists, the electrode layer 30 is exposed at the upper surface of the signal electrode pad 16. The support layer 32 extends in a lattice shape at the upper surface of the signal electrode pad 16. More specifically, the support layer 32 comprises an outermost peripheral portion 32a that extends in a rectangular ring shape, and a lattice-shaped portion 32b that extends in a lattice shape inside the outermost peripheral portion 32a. As shown in FIG. 3, the support layer 32 extends downward from the upper surface of the signal electrode pad 16, and reaches a lower surface of the signal electrode pad 16 (i.e., the upper surface of the semiconductor substrate 12). In other words, the support layer 32 penetrates the electrode layer 30 from an upper surface of the electrode layer 30 to a lower surface of the electrode layer 30. The electrode layer 30 exists in each of ranges 34 surrounded by the lattice-shaped support layer 32, and in a range 36 outside the outermost peripheral portion 32a of the support layer 32.

The wire 20 is constituted of a metal that mainly contains copper. For example, the wire 20 may be constituted of a simple substance of copper. The wire 20 is harder than the electrode layer 30, and is softer than the support layer 32. The wire 20 comprises a linear portion 20a that has a small diameter, and a distal end portion 20b that has a large diameter. The distal end portion 20b is bonded on the upper surface of the signal electrode pad 16. It should be noted that FIG. 2 illustrates a range 20c where the wire 20 (i.e., the distal end portion 20b) is in contact with the signal electrode pad 16. As shown in FIGS. 2 and 3, the distal end portion 20b is in contact with an entirety of an upper surface of the support layer 32, and the electrode layer 30 in a range adjacent to the support layer 32. At an interface between the distal end portion 20b and the electrode layer 30, an alloy of aluminum and copper (e.g., CuAl, $CuAl_2$, or the like) is formed. The distal end portion 20b is firmly connected, via this alloy, to the electrode layer 30. Although the distal end portion 20b and the support layer 32 tightly contact with each other, an alloy layer is hardly formed at an interface between the distal end portion 20b and the support layer 32. Therefore, connection strength between the distal end portion 20b and the support layer 32 is not so high as connection strength between the distal end portion 20b and the electrode layer 30. The linear portion 20a extends upward from the distal end portion 20b. The other end of the linear portion 20a is connected to the lead wire 18 (see FIG. 1).

The signal electrode pad 16 and the wire 20 are covered with an insulating resin 40. The insulating resin 40 includes sulfur.

At the interface between the wire 20 and the electrode layer 30, an alloy is likely to be formed. On the other hand, at the interface between the wire 20 and the support layer 32, an alloy is less likely to be formed. Moreover, at an interface between the support layer 32 and the electrode layer 30, an alloy is less likely to be formed.

As shown in FIGS. 2 and 3, in an outermost peripheral portion of a connection region of the signal electrode pad 16 and the wire 20, the wire 20 and the electrode layer 30 are in contact with each other. When heat (180° C. or higher) is applied to the interface between the wire 20 and the electrode layer 30, an alloying reaction between copper and aluminum is promoted at the interface. Consequently, at the interface between the wire 20 and the electrode layer 30, $Cu_9Al_4$ is generated. Then, sulfur in the insulating resin 40 and $Cu_9Al_4$ react according to an equation of $Cu_9Al_4 + SO_2 \rightarrow Al_2(SO_4)_3 + Cu$, and thereby an aluminum oxide layer is generated. Since aluminum oxide is brittle, the wire 20 is likely to peel off from the electrode layer 30 along the aluminum oxide layer. When the peeling occurs, sulfur intrudes into the peeled portion, and thereby the peeling further proceeds by the above-mentioned reaction. The peeling proceeds toward a center side of the distal end portion 20b along the interface between the wire 20 and the electrode layer 30. When the peeling proceeds to a certain degree, the peeling reaches the outermost peripheral portion 32a of the support layer 32. Accordingly, sulfur is supplied to the interface between the wire 20 and the support layer 32. However, even though sulfur is supplied, an alloy is hardly generated between the wire 20 and the support layer 32. Accordingly, the peeling is less likely to occur at the interface between the wire 20 and the support layer 32. Therefore, the peeling stops at the outermost peripheral portion 32a of the support layer 32. Accordingly, no sulfur is supplied to each range 34 surrounded by the support layer 32, and the peeling of the wire 20 from the electrode layer 30 is suppressed in each range 34. Moreover, an alloy is hardly generated between the electrode layer 30 and the support layer 32 as well, and hence proceeding of the peeling along the interface between the electrode layer 30 and the support layer 32 is also suppressed. Therefore, in this semiconductor device, the wire 20 is less likely to peel off from the signal electrode pad 16.

Figure 4:
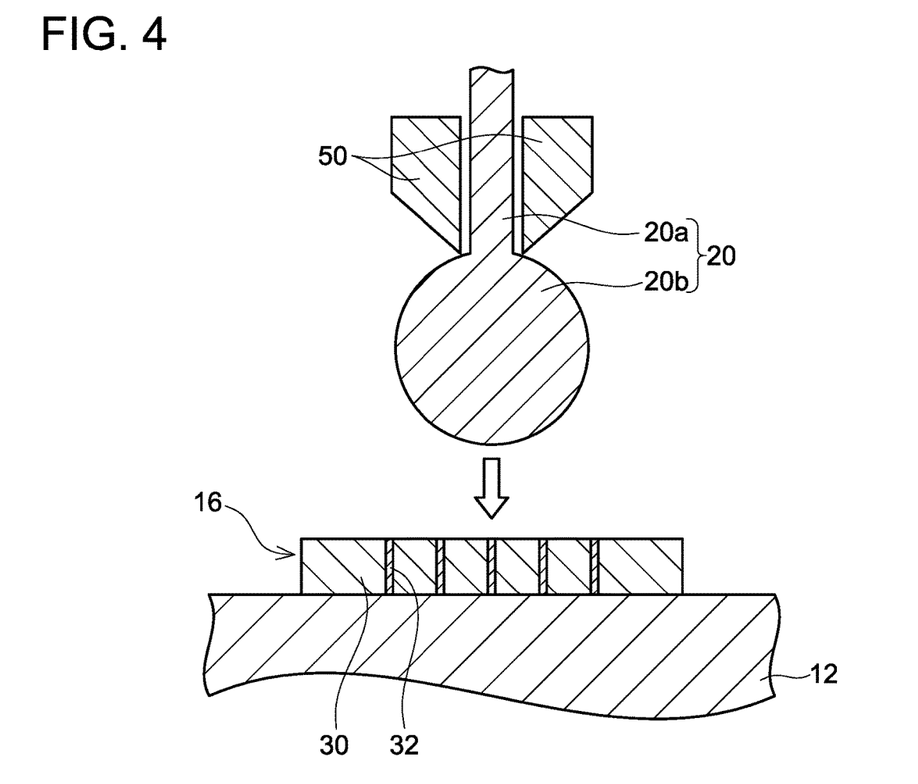
FIG. 4 is an explanatory diagram of a bonding step.

In a manufacturing process of the semiconductor device shown in FIGS. 1 to 3, a wire bonding step of bonding the wire 20 on the signal electrode pad 16 is performed. As shown in FIG. 4, prior to the wire bonding, the electrode layer 30 and the support layer 32 are exposed at the upper surface of the signal electrode pad 16. A wire bonding machine used in the wire bonding step includes a capillary 50 shown in FIG. 4. The wire 20 is inserted into a center hole of the capillary 50, and a distal end of the wire 20 protrudes downward from a distal end of the capillary 50. In the wire bonding step, the distal end of the wire 20 is once melted by electrical discharge, and thereby a ball is formed at the distal end portion 20b of the wire 20 as shown in FIG. 4. The distal end portion 20b (the ball) has a diameter larger than a diameter of the linear portion 20a. During the wire bonding step, the signal electrode pad 16 is heated by the wire bonding machine.

Figure 5:
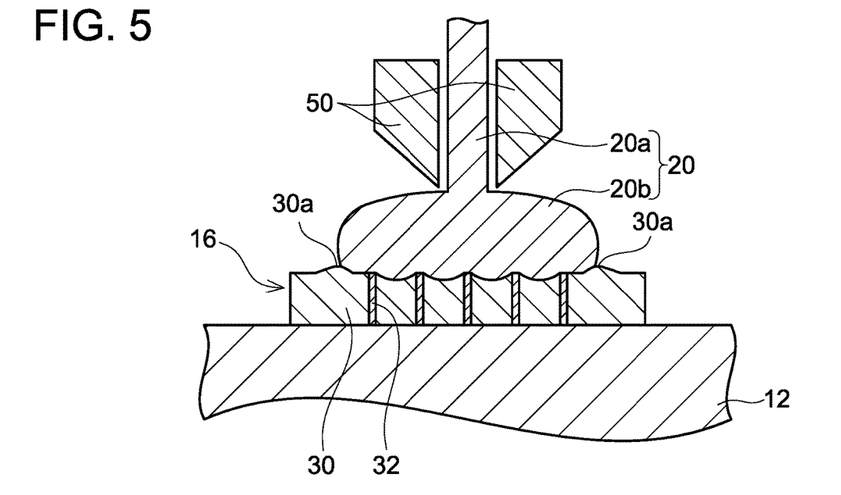
FIG. 5 is an explanatory diagram of the bonding step.

Next, as shown in FIG. 5, the capillary 50 is moved toward the signal electrode pad 16, and thereby the distal end portion 20b is pressed against the signal electrode pad 16. Moreover, simultaneously with pressing the distal end portion 20b against the signal electrode pad 16, the capillary 50 applies ultrasonic waves to the distal end portion 20b. The distal end portion 20b is thereby connected to the signal electrode pad 16. The distal end portion 20b is crushed by a load from the capillary 50. The crushed distal end portion 20b is in contact with an entirety of the support layer 32 exposed at the upper surface of the signal electrode pad 16, and the electrode layer 30 in the range adjacent to the support layer 32. Moreover, the electrode layer 30 in the range in contact with the distal end portion 20b and the support layer 32 receive a load from the distal end portion 20b. The electrode layer 30 is compressed in its thickness direction by the load. On the other hand, since the support layer 32 is hard, the support layer 32 hardly deforms even when receiving the load. Accordingly, the support layer 32 supports the distal end portion 20b. Consequently, the load imposed on the electrode layer 30 is alleviated. Accordingly, the deformation of the electrode layer 30 in its thickness direction is suppressed. Since the deformation of the electrode layer 30 in its thickness direction is suppressed, an amount of the electrode layer 30 pushed out toward a periphery of the signal electrode pad 16 is small. Accordingly, the electrode layer 30 is suppressed from projecting around the distal end portion 20b. In other words, a height of a projecting portion 30a formed around the distal end portion 20b becomes smaller than in conventional configurations. As such, according to this manufacturing method, aluminum splash is suppressed. In particular, since the support layer 32 comprises the outermost peripheral portion 32a that extends in the ring shape, the electrode layer 30 in the range surrounded by the outermost peripheral portion 32a is suppressed from being pushed out to outside of the outermost peripheral portion 32a. Moreover, since the support layer 32 is provided in the lattice shape inside the outermost peripheral portion 32a, the electrode layer 30 in each range 34 surrounded by the support layer 32 is suppressed from being moved in a transverse direction. Accordingly, in this manufacturing method, aluminum splash is suppressed more effectively. Moreover, an alloy such as CuAl or $CuAl_2$ is formed at the interface between the distal end portion 20b and the electrode layer 30, and the distal end portion 20b and the electrode layer 30 are firmly connected. Thereafter, an opposite end portion of the wire 20 is bonded on the lead wire 18.

As described above, according to the configuration of the embodiment, it is possible to firmly connect the wire 20 to the signal electrode pad 16, while suppressing aluminum splash. Moreover, according to the configuration of the embodiment, the peeling of the wire 20 due to intrusion of sulfur can be suppressed.

Figure 6:
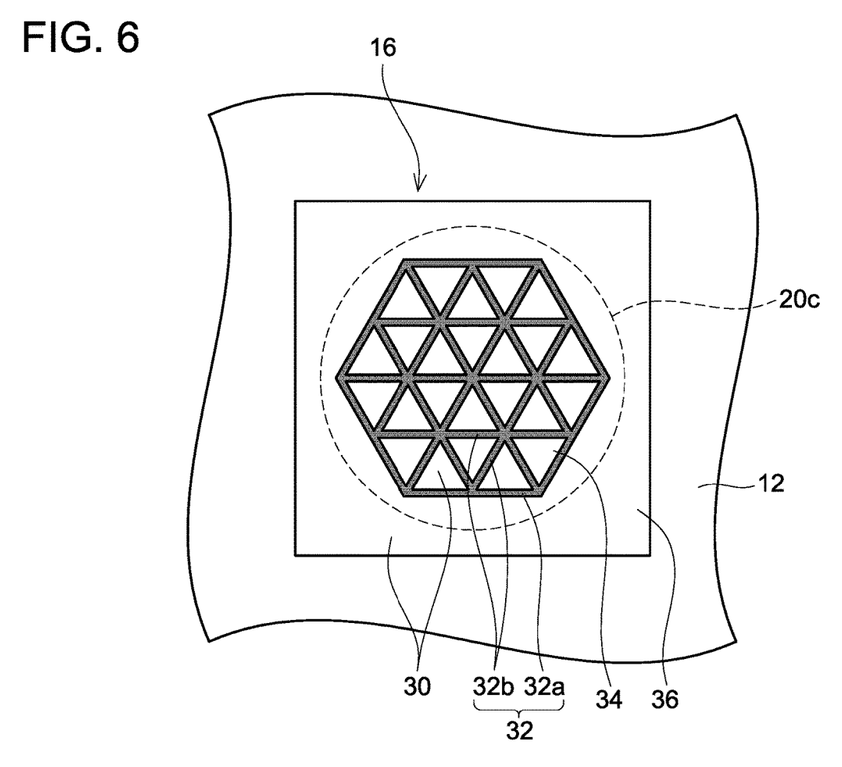
FIG. 6 is an enlarged top view of a signal electrode pad of a variation.
Figure 7:
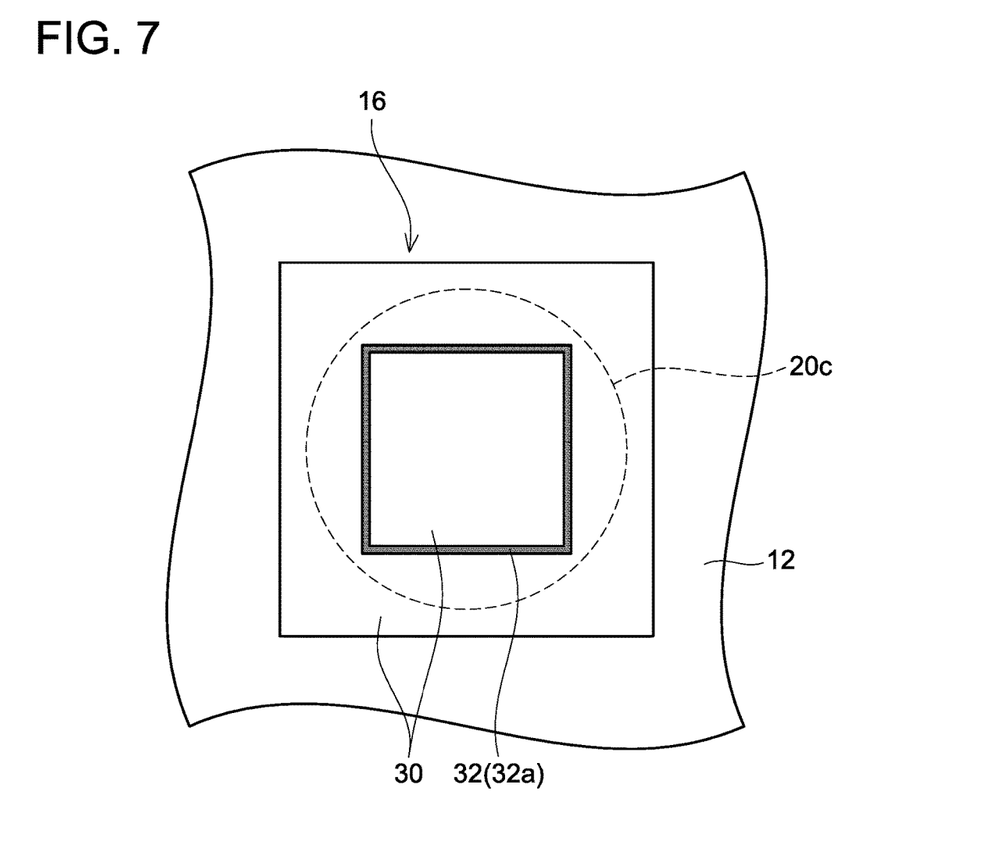
FIG. 7 is an enlarged top view of a signal electrode pad in another variation.
Figure 8:
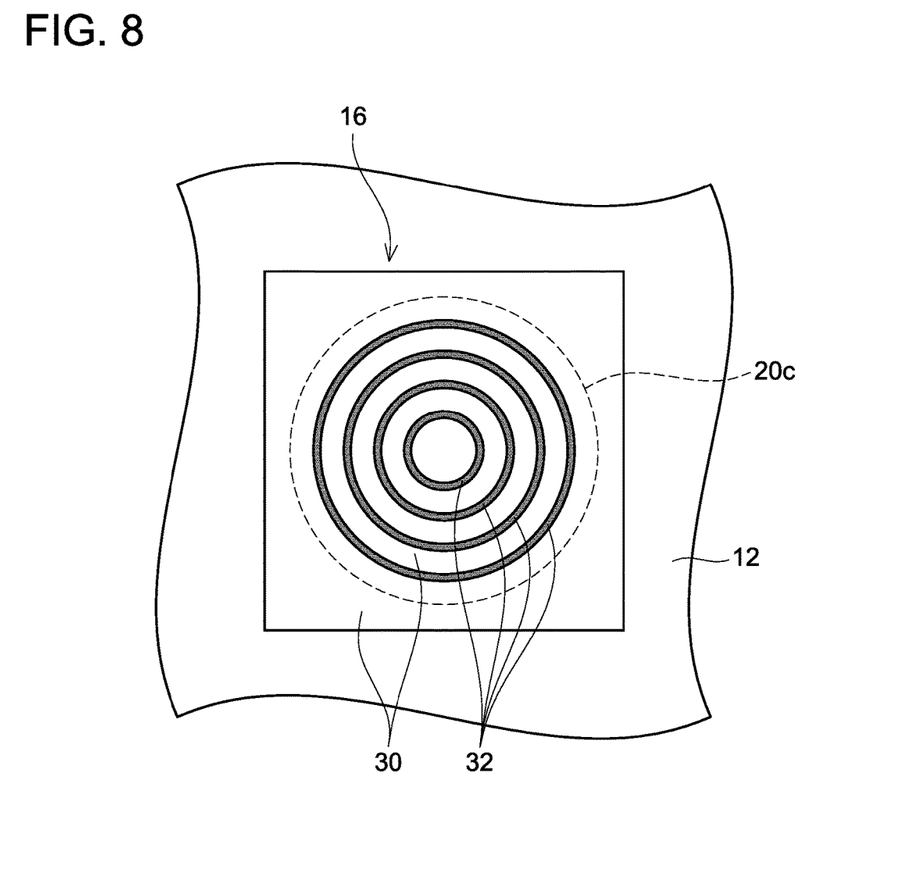
FIG. 8 is an enlarged top view of a signal electrode pad in yet another variation.
Figure 9:
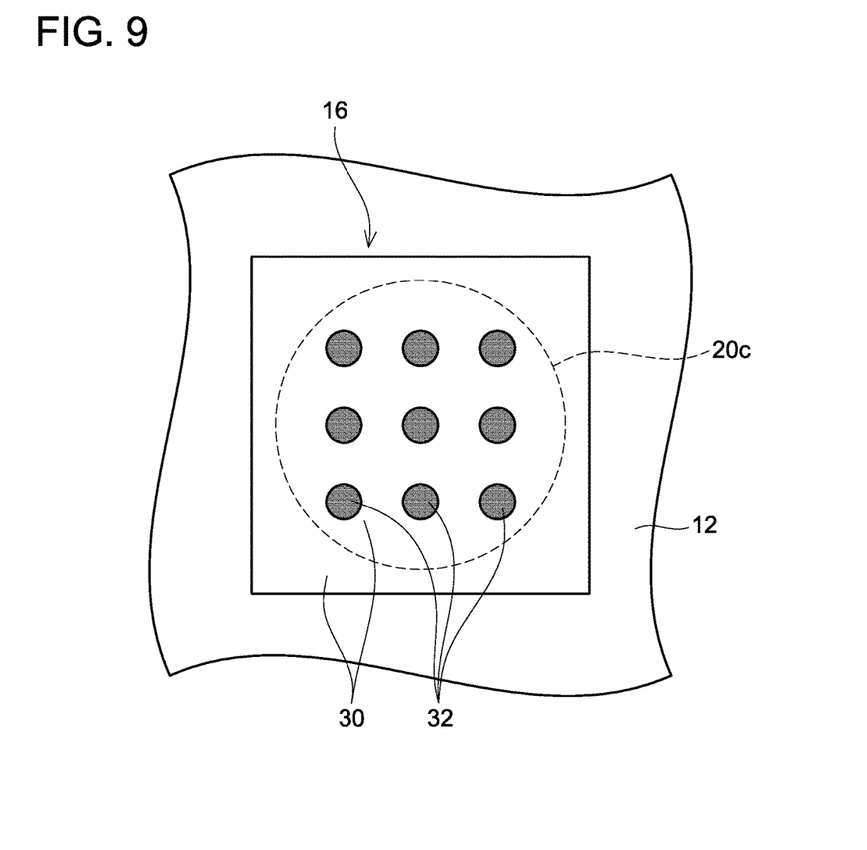
FIG. 9 is an enlarged top view of a signal electrode pad in another variation.

It should be noted, in the embodiment mentioned above, the support layer 32 extends in a quadrangular lattice shape, as seen from above. However, as shown in FIG. 6, the support layer 32 may extend in a hexagonal lattice shape. Moreover, as shown in FIG. 7, the support layer 32 may be constituted of the ring-shaped outermost peripheral portion 32a only. Moreover, as shown in FIG. 8, the support layer 32 may be provided in concentric circles. With these configurations as well, the support layer 32 can suitably support the distal end portion 20b of the wire 20, and movement of the electrode layer 30 in the transverse direction can be suppressed. Moreover, as shown in FIG. 9, a plurality of the support layers 32 may be arranged in a separated manner. With this configuration as well, the support layers 32 can suitably support the distal end portion 20b of the wire 20. Moreover, movement of the electrode layer 30 in the transverse direction can be suppressed by an anchor effect of each support layer 32.

Figure 10:
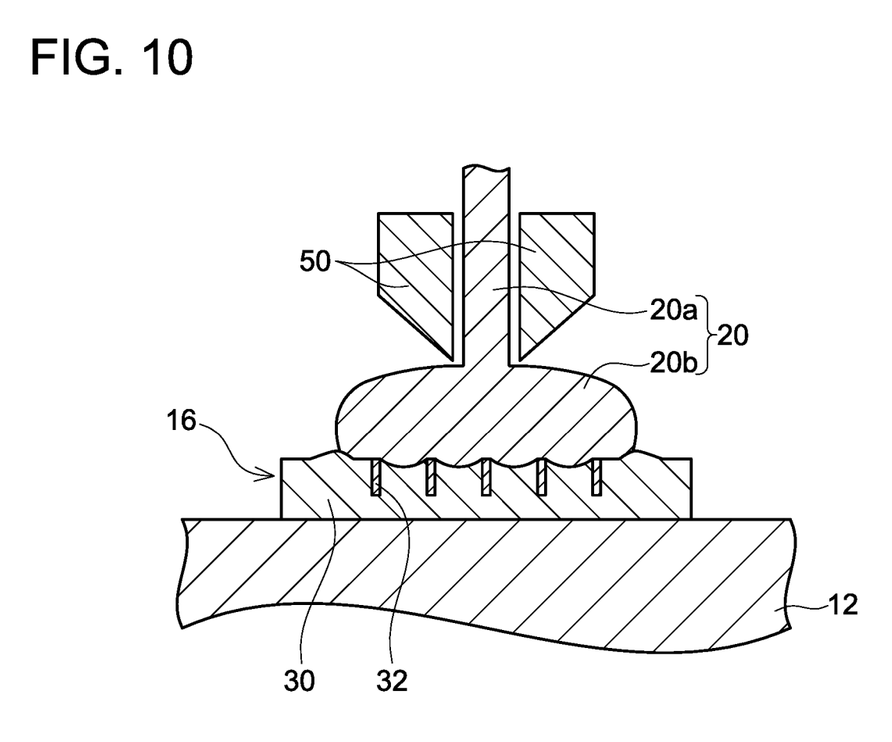
FIG. 10 is an enlarged cross-sectional view of a signal electrode pad in yet another variation.

Moreover, in the embodiment mentioned above, the support layer 32 penetrates the electrode layer 30 from the upper surface of the electrode layer 30 to the lower surface of the electrode layer 30. However, as shown in FIG. 10, the support layer 32 may not reach the lower surface of the electrode layer 30. With this configuration as well, since the support layer 32 is provided to be exposed at the upper surface of the signal electrode pad 16, aluminum splash can be suppressed. Moreover, with this configuration as well, the peeling due to intrusion of sulfur can be stopped. However, with the configuration in FIG. 10, there may be a case Where a load is imposed on a portion of the electrode layer 30 below the support layer 32, and this portion deforms. Therefore, the configuration in which the support layer 32 penetrates the electrode layer 30 from the upper surface of the electrode layer 30 to the lower surface of the electrode layer 30 has a higher suppressing effect on aluminum splash.

Moreover, in the embodiment mentioned above, the wire bonding is performed such that the distal end portion 20b of the wire 20 makes contact with the entirety of the upper surface of the support layer 32. However, due to displacement of bonding position or the like, a part of the upper surface of the support layer 32 may exist outside a contact range of the wire 20. In such a case as well, aluminum splash can be suppressed to a certain degree.

Moreover, in the embodiment mentioned above, the support layer 32 is constituted of a metal that mainly contains tungsten. However, the support layer 32 may be constituted of an insulating material that mainly contains silicon oxide. Moreover, the support layer 32 may be constituted of another material harder than the wire 20.

A relation between a constituent element of the embodiment and a constituent element of the claims will be described. The outermost peripheral portion 32a in the embodiment is an example of a ring-shaped portion in the claims.

Some of the technical features disclosed herein will be listed hereinbelow. Each of the below technical elements is independently useful.

In an example of the semiconductor device disclosed herein, the support layer may penetrate the electrode layer from an upper surface of the electrode layer to a lower surface of the electrode layer.

According to this configuration, the electrode pad is much less likely to be crushed, and aluminum splash can be suppressed more suitably.

In an example of the semiconductor device disclosed herein, the support layer may comprise a ring-shaped portion extending in a ring shape at an upper surface of the electrode pad.

According to this configuration, at bonding, movement of the electrode layer inside the ring-shaped portion, toward an outside of the ring-shaped portion, can be suppressed. Accordingly, aluminum splash can be suppressed more suitably.

In an example of the semiconductor device disclosed herein, the support layer may comprise a lattice-shaped portion extending in a lattice shape at the upper surface of the electrode pad in a range surrounded by the ring-shaped portion.

According to this configuration, at bonding, movement of the electrode layer in the transverse direction can be suppressed. Accordingly, aluminum splash can be suppressed more suitably.

In an example of the semiconductor device disclosed herein, the wire may be in contact with an entirety of the ring-shaped portion.

According to this configuration, aluminum splash can be suppressed more suitably.

In an example of the semiconductor device disclosed herein, the electrode pad may comprise a plurality of the support layers being in contact with the wire.

According to this configuration, since the plurality of the support layers can support the wire, the electrode pad is much less likely to be crushed. Accordingly, aluminum splash can be suppressed more suitably.

In an example of the semiconductor device disclosed herein, the electrode pad and the wire may be covered with a resin including sulfur. A combination of the wire and the support layer may be less likely to be alloyed than a combination of the wire and the electrode layer.

When sulfur intrudes from the resin into the interface between the wire and the electrode layer, copper and aluminum are activated, and an alloying reaction proceeds.

Consequently, a $Cu_9Al_4$ alloy is generated at the interface between the wire and the electrode layer, and the wire peels off from the electrode layer. This peeling proceeds along the interface between the wire and the electrode layer. If the wire and the support layer are less likely to be alloyed as described above, the peeling that proceeds along the interface between the wire and the electrode layer stops at the interface between the wire and the support layer, and thereby it is possible to prevent the peeling from further proceeding.

In an example of the semiconductor device disclosed herein, the support layer may include tungsten.

According to this configuration, a current can flow through the support layer as well.

In an example of the semiconductor device disclosed herein, the support layer may include silicon oxide.

According to this configuration, the support layer can be formed easily.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device, comprising:
   an electrode pad provided above a semiconductor substrate; and
   a wire bonded on the electrode pad and including copper, wherein
   the electrode pad comprises an electrode layer including aluminum and a support layer harder than the wire and the electrode layer, and
   the wire is in direct contact with the electrode layer and the support layer.

2. The semiconductor device of claim 1, wherein the support layer penetrates the electrode layer from an upper surface of the electrode layer to a lower surface of the electrode layer.

3. The semiconductor device of claim 1, wherein the support layer comprises a ring-shaped portion extending in a ring shape at an upper surface of the electrode pad.

4. The semiconductor device of claim 3, wherein the support layer comprises a lattice-shaped portion extending in a lattice shape at the upper surface of the electrode pad in a range surrounded by the ring-shaped portion.

5. The semiconductor device of claim 3, wherein the wire is in direct contact with an entirety of the ring-shaped portion.

6. The semiconductor device of claim 1, wherein the electrode pad comprises a plurality of the support layers being in direct contact with the wire.

7. The semiconductor device of claim 1, wherein
   the electrode pad and the wire are covered with a resin including sulfur, and
   a combination of the wire and the support layer is less likely to be alloyed than a combination of the wire and the electrode layer.

8. The semiconductor device of claim 1, wherein the support layer includes tungsten.

9. The semiconductor device of claim 1, wherein the support layer includes silicon oxide.

10. A method of manufacturing a semiconductor device, the method comprising:
    bonding a wire including copper on an electrode pad provided above a semiconductor substrate,
    wherein
    the electrode pad comprises an electrode layer including aluminum and a support layer harder than the wire and the electrode layer, and
    the wire is bonded on the electrode pad so that the wire makes direct contact with the electrode layer and the support layer in the bonding.

* * * * *